United States Patent
Huisstede

(10) Patent No.: US 9,435,584 B2
(45) Date of Patent: Sep. 6, 2016

(54) DEVICE AND METHOD FOR SEPARATING, AT LEAST PARTIALLY DRYING AND INSPECTING ELECTRONIC COMPONENTS

(71) Applicant: Besi Netherlands B.V., Duiven (NL)

(72) Inventor: Jurgen Hendrikus Gerhardus Huisstede, Goor (NL)

(73) Assignee: Besi Netherlands B.V., Duiven (NL)

( * ) Notice: Subject to any disclaimer, the term of this patent is extended or adjusted under 35 U.S.C. 154(b) by 105 days.

(21) Appl. No.: 14/412,024

(22) PCT Filed: Jul. 3, 2013

(86) PCT No.: PCT/NL2013/050486
§ 371 (c)(1),
(2) Date: Dec. 30, 2014

(87) PCT Pub. No.: WO2014/007619
PCT Pub. Date: Jan. 9, 2014

(65) Prior Publication Data
US 2015/0143711 A1 May 28, 2015

(30) Foreign Application Priority Data

Jul. 6, 2012 (NL) .................................. 2009147

(51) Int. Cl.
*F26B 3/00* (2006.01)
*F26B 3/28* (2006.01)
*H01L 21/67* (2006.01)
*H01L 21/677* (2006.01)

(52) U.S. Cl.
CPC ......... *F26B 3/283* (2013.01); *H01L 21/67017* (2013.01); *H01L 21/6776* (2013.01); *H01L 21/67173* (2013.01); *H01L 21/67721* (2013.01)

(58) Field of Classification Search
CPC .......... F26B 3/00; F26B 3/283; F26B 21/00; F26B 21/06; H01L 21/00; H01L 21/20
USPC ................... 34/245, 266, 269, 275; 118/719; 156/345.45, 345.52
See application file for complete search history.

(56) References Cited

U.S. PATENT DOCUMENTS

| | | | | | |
|---|---|---|---|---|---|
| 5,732,476 | A | * | 3/1998 | Pare | B01D 1/0017 202/182 |
| 7,892,382 | B2 | * | 2/2011 | Bellmann | B41M 5/265 156/230 |
| 7,974,739 | B2 | * | 7/2011 | Nelson | F26B 3/30 700/258 |
| 8,844,158 | B2 | * | 9/2014 | Dehn | A61F 13/00008 156/305 |
| 8,904,668 | B2 | * | 12/2014 | Priebe | F26B 3/22 101/450.1 |

(Continued)

FOREIGN PATENT DOCUMENTS

| | | | | |
|---|---|---|---|---|
| KR | 20150035600 A | * | 4/2015 | ....... H01L 21/67017 |
| NL | WO 2009145623 A1 | * | 12/2009 | ............... F26B 5/16 |
| WO | 2009150239 A1 | | 12/2009 | |

*Primary Examiner* — Stephen M Gravini
(74) *Attorney, Agent, or Firm* — The Webb Law Firm

(57) ABSTRACT

The invention relates to a device for separating, at least partially drying and inspecting electronic components, comprising: separating means, a carrier for the electronic components, a heating source for generating radiant heat, displacing means for displacing the carrier for the electronic components relative to the heating source, and visual inspection means. The heating source is configured to generate radiant heat in order to selectively heat and evaporate moisture present on the separated electronic components.

15 Claims, 2 Drawing Sheets

(56) References Cited

U.S. PATENT DOCUMENTS

| | | |
|---|---|---|
| 2009/0181552 A1 | 7/2009 | Shimomura et al. |
| 2011/0113645 A1* | 5/2011 | Huisstede ............... F26B 5/16 34/353 |
| 2011/0165316 A1 | 7/2011 | Baccini |
| 2013/0300857 A1* | 11/2013 | Zweers ............ H01L 21/67336 348/92 |
| 2015/0143711 A1* | 5/2015 | Huisstede ......... H01L 21/67017 34/245 |

* cited by examiner

DEVICE AND METHOD FOR SEPARATING, AT LEAST PARTIALLY DRYING AND INSPECTING ELECTRONIC COMPONENTS

CROSS-REFERENCE TO RELATED APPLICATIONS

This application is the United States national phase of International Application No. PCT/NL2013/050486 filed Jul. 3, 2013, and claims priority to Netherlands Patent Application No. 2009147 filed Jul. 6, 2012, the disclosures of which are hereby incorporated in their entirety by reference.

BACKGROUND OF THE INVENTION

1. Field of the Invention

The invention relates to a device and a method for separating, at least partially drying and inspecting electronic components.

2. Description Of Related Art

During the process of manufacturing electronic components, such as more particularly semiconductor products, these are usually manufactured in a larger whole of electronic components which is subsequently divided (this process is also referred to as separating, singulating or individualizing) into small units of one or several individual electronic components. Examples are packages with a plurality of optionally wholly encapsulated electronic components placed on a carrier, and wafers consisting of a silicon carrier on which are arranged electronic components divided into smaller units. The division can be realized by means of different types of machining process, such as sawing while making use of liquid to flush and/or cool the electronic components during the division. Separation is also possible using a cutting liquid. Residual liquid is usually still present on the separated electronic components following the division and/or residual material (fragments) must usually be removed from the divided electronic components. Cleaning generally takes place with a liquid (such as water) which must then be removed.

In order to control product quality and not impede subsequent processes on the separated electronic components it is desirable to remove the residual liquid from the separated electronic components. According to the prior art use is made for drying purposes of blowing means with which the adhering liquid can be blown off the electronic components. Another method of drying which is applied is heating of the separated electronic components by means of heated plates (with a temperature of for instance 70-80° C.) so as to thus evaporate the liquid (water). Yet another drying method makes use of tamponing equipment with which the adhering moisture is removed from the electronic components by means of absorption.

It is known here to make use of a device in which the separated electronic components are placed on a carrier and then brought into contact with blowing means, tamponing equipment or combinations thereof. Such drying equipment is generally provided with transport means for displacing the carrier for the electronic components relative to the blowing means, tamponing equipment or combinations thereof.

The existing techniques for successively separating, drying and inspecting electronic components have the drawback that, in the case blowing means are used, the residual liquid is displaced in an undefined manner. The undefined displacement of the liquid for removal means that the liquid is not removed in controlled manner, and also that it can be displaced to non-desired positions. A drawback of heating the electronic components using heated plates is that this is a slow process requiring a long cycle time. A further drawback of applying heated plates is that physical contact has to be made between the electronic components and the heated plates.

A drawback of tamponing is also that physical contact is made with the usually very vulnerable separated electronic components. Other drawbacks of the use of tamponing equipment are that the effect of the moisture-absorbent material is diminished (or even lost) because saturation of the moisture-absorbent material takes place and because bacterial growth can occur. The drying action will thus possibly vary in the course of time.

The present invention has for its object to provide an improved device and method for separating, at least partially drying and inspecting electronic components with which, while maintaining the advantages of the prior art, separation remains possible while making use of a liquid, the surplus liquid can be removed in efficient and controlled manner and the inspection of the separated electronic components can subsequently be performed in effective manner.

SUMMARY OF THE INVENTION

The invention provides for this purpose a device for separating, at least partially drying and inspecting electronic components, comprising: a separating device for dividing a larger whole of electronic components into separated electronic components; a carrier for the separated electronic components; a heating source for generating radiant heat; displacing means for displacing the carrier for the separated electronic components relative to the heating source; and visual inspection means for inspecting the separated electronic components; wherein the heating source is configured to generate radiant heat with a wavelength in the range of 1 µm to 5 µm.

Such a radiant heat has a wavelength in the near-infrared region. The term "near-infrared" is understood to mean a wavelength in the range of about 780 nm to about 10 µm, preferably in the range of about 900 nm to about 5 µm, more preferably in the range of about 1 µm to about 4 µm, and in particular in the range of about 1.5 µm to about 3.5 µm. The emission spectrum of the radiant heat is preferably selected here such that it coincides with the absorption spectrum of the liquid (water). In addition, the efficiency of the heating source does of course also determine the choice thereof in practice. Such a device makes it possible to selectively heat and remove by means of evaporation the residual liquid present on the electronic components as a result of the separation, after which an effective visual inspection of the separated electronic components can also take place. The advantageous effect of the manner of processing electronic components according to the present invention is therefore that use of liquid during and/or following the separation process remains possible, a selective manner of heating is applied and an effective visual inspection is then possible. The drying in particular can be performed efficiently. Water for instance has a strong absorption for infrared light (1-5 µm wavelength). It is as a result of this that particularly the liquid absorbs energy from the radiant heat. This means that the liquid for removal will be heated relatively more strongly than the separated electronic components and/or components of the drying device. The separated electronic components are substantially not heated. The heating energy is hereby employed effectively and the separated electronic components and/or components of the drying device are not heated, or heated to lesser extent, by the heating source. As a result the drying of separated electronic components takes place efficiently with only slight heating of parts other than the liquid for removal. Owing to the selective heating of the liquid only a short irradiation time is required. An irradiation time can be envisaged here in the order of magnitude of 2 to 6 seconds, more particularly 3 to 5 seconds.

The device is also provided with inspection means for inspecting the separated electronic components which can for instance be embodied as a sensor or camera for detecting the dried separated electronic components. This sensor or camera will normally be connected to an intelligent control system for controlling other processes. The heating source can for instance thus be actuated (for instance when it is detected that not all liquid has been removed), while subsequent production processes can also be actuated in order to respond to detected imperfections in the appearance of determined separated electronic components. An intelligent control system can for instance consist of a computer. The advantage of presence detection in combination with a control system is that, for instance in the case of imminent excessive heating of separated electronic components, the heating source can be switched off or the heating intensity of the heating source can be reduced. In addition, the sensors can detect the presence of the separated electronic components for drying and, in their absence, switch off the heating source or reduce the heating intensity thereof via the intelligent control system. The advantages of a visual inspection linked to such a control are prevention of (local) overheating of the electronic components, energy-saving and an increased lifespan of the heat source. Another option is the removal and/or replacement of separated electronic components which do not comply with determined external characteristics by separated electronic components which have been approved. A subsequent processing station for the dried and separated electronic components can for instance be actuated for this purpose by the intelligent control.

In an advantageous embodiment of the present invention the heating source comprises a heating element with a spiral filament. This spiral filament can for instance be manufactured from tungsten, constantan or combinations thereof. The spiral filament is more preferably manufactured from tungsten. The heating source can also comprise a ceramic heating element. Such heating elements are readily available as standard purchasable parts which are inexpensive, compact and easy to replace, and the radiant heat can be properly targeted.

The heating source preferably comprises a heating element provided with a quartz lamp which is configured to generate radiant heat with a wavelength in the desired radiation region having a wavelength in the range of 1 μm to 5 μm. An example of such a quartz lamp is a halogen quartz lamp, in particular a tungsten halogen quartz lamp. These lamps are efficient in the desired range. The switching time is also an important factor in the selection of a specific heating source. It is desirable for the heating source in the device according to the present invention that the heat-up time is short (for instance 1-5 seconds) and that the radiant heat emitted by the heating source also dissipates quickly after switch-off (preferably to substantially 0 within a few seconds). The process can thus be activated and deactivated relatively quickly, which enhances the flexibility in the control thereof but which is also particularly desirable from the safety viewpoint and in preventing overheating of the electronic components (for instance when the process stops). Such short switching times cannot be realized with other heating sources such as ceramic or quartz heating elements.

The heating elements preferably have per element a heating capacity in the order of magnitude of 1000 W. It is possible here to assemble the heating source from a plurality of heating elements. Particularly important when choosing a determined power is the power emitted per unit area (this term also being referred to as spectral power density). Excessive local heating can thus be prevented, and the form of the heating source can be adapted to the arrangement in which the electronic components for drying are presented. Available in practice are heating elements with a length of about 280 mm. Also a factor in the selection of a heating element are the possibilities of the device in which the heating element is incorporated.

In a further embodiment of the present invention the heating source is also provided with a reflector. This reflector preferably faces toward the separated electronic components for drying. The use of a reflector has the advantage that the radiant heat generated by the heating source can be transmitted at least substantially precisely to where it is required for the drying process. The reflector can form part of the heating element but may also be located outside the heating element.

In order to further limit the loss of radiant heat, in a further embodiment of the present invention the device comprises insulating material. The vicinity of the heating element can be protected from undesirable excessive heating by means of insulating material. Screening plates can for instance thus be placed in the vicinity of the heating element so as to prevent conduction.

In another embodiment the device according to the present invention is provided with an extractor for discharging gas surrounding the electronic components for drying. An underpressure can be applied relative to the ambient pressure by means of extractor means at the position where the electronic components for drying are located during heating. These extractor means enable extraction of gas surrounding the electronic components for drying. As a result of the selective heating of the liquid for removal, the air close to the separated electronic components will acquire a higher air humidity (or even become saturated) during the heating as a result of the evaporating liquid. Extraction of this air with higher air humidity increases the effectiveness of the drying process and enables controlled discharge of the evaporating liquid from the electronic products. It is also possible to apply blow air in order to thus increase the evaporation rate of the liquid. It is further optionally possible to apply one or more air knives or blow nozzles following irradiation of the separated electronic components for drying with the heating element. The evaporation rate of the liquid for removal can hereby also be increased. This additional blowing is even possible with cold air.

The invention also provides a method for separating, at least partially drying and inspecting electronic components, comprising the processing steps of a) dividing a greater whole of electronic components into separated electronic components; b) displacing the separated electronic components with adhering liquid lying in a plane and held by a carrier; c) supplying heat to the assembly of separated electronic components with adhering liquid using a heating source; and d) visually inspecting the separated electronic components dried by the heating source, wherein the assembly of electronic components with adhering liquid is irradiated by the heating source with radiant heat with a wavelength in the range of 1 μm to 5 μm. Using this method the advantages can be realized as already described above with reference to the device according to the present invention. The electronic components can be separated in efficient manner, the liquid for removal can be selectively heated while the separated electronic components and the machine parts are not heated, or heated less, and the separated electronic components can be visually inspected.

As already described above, the at least partial drying of separated electronic components with adhering liquid is preceded by a process wherein the electronic components are separated. Examples of such separating operations are for instance sawing, (laser) cutting and liquid cutting. It is precisely the separation which causes the electronic components to be provided with an adhering liquid (such as cooling liquid and/or washing liquid), which is desirable when utilized during separation but which for the purpose of further processing, more particularly for inter alia an accurate visual inspection, must however be absent.

The at least partial drying of separated electronic components with adhering liquid is followed by a visual inspection of the dried separated electronic components. Such a visual inspection is also referred to as "vision" and is applied in order to determine the quality of the separated electronic components. A problem in visually determining the quality of the separated electronic components is that liquid residues left behind can affect the quality measurement. During the visual inspection of solder balls (ball detection), for instance for the purpose of determining diameter and position of the balls, the presence of a liquid film on or around the solder balls can thus have a disruptive effect. Owing to the surface tension of the liquid it cannot be wholly removed from the balls by means of blowing or tamponing. The presence of liquid residues can result in incorrect approval and incorrect rejection of individual separated electronic components. By means of the successive processing steps (separating, selectively heating and visual inspection) according to the present invention the separation can be performed without limitation in respect of use of liquid in combination with a subsequent visual inspection which can be performed with a high degree of reliability.

In a variant of the method according to the present invention the irradiation of the assembly of electronic components with adhering liquid takes place with the heating source for a local irradiation time of 2 to 30 seconds, more preferably a local irradiation time of 3 to 20 seconds. The term "local irradiation time" is understood to mean the period of time for which the separated electronic components with adhering liquid for drying are irradiated at a specific position by the heating source of the present invention. The local irradiation time is preferably about 5 seconds ±2 seconds, although good results have also been achieved with local irradiation times of between 5 and 10 seconds, and irradiation times of between 10 and 25 seconds. It will be apparent that local overheating is once again an important reason for limiting the maximum irradiation time. A minimum irradiation time is on the other hand required to enable sufficient heat to be transmitted to the liquid for removal such that it will evaporate.

The irradiation of the assembly of electronic components with adhering liquid according to the method of the present invention preferably takes place with one or more heating elements with a maximum heating capacity of 1000 W. The minimum heating capacity of the heating elements is 200 W, 400 W, 600 W or 800 W. The overall heating capacity of the heating source can thus be easily determined by the number of heating elements to be used.

In a particular embodiment variant of the method of the present invention the assembly of electronic components with adhering liquid is heated with a quartz lamp, such as for instance a quartz lamp configured to generate radiant heat with a wavelength in the near-infrared region. Such a quartz lamp can generate radiant heat with a wavelength in the range of 1 µm to 5 µm. A specific example of such a quartz lamp is a tungsten halogen quartz lamp.

In an advantageous embodiment of the present invention the evaporating liquid such as is formed during processing step c) is extracted. The air with increased air humidity as a result of the evaporating liquid can then be extracted in order to thus remove the liquid from the electronic components and remove it from the drying device, so that for instance condensation of the evaporated liquid at an undesirable location can also be prevented.

In another specific variant of the method according to the invention local irradiation of the assembly of electronic components with adhering liquid takes place with a heating source which is positioned relative to the assembly of electronic components with adhering liquid such that the assembly is heated on one side, although alternatively it is also possible to opt to heat the assembly on two sides. In order to prevent excessive heating of the carrier holding the separated electronic components with adhering liquid, it is desirable for this carrier to be manufactured from a material which is less sensitive than the liquid for removal to radiant heat with a wavelength in the range of 1 µm to 5 µm.

In yet another variant of the method according to the present invention the heating source is switched on when an assembly of electronic components with adhering liquid is present, and the heating source is switched off when a maximum local irradiation time has passed or in the absence of an assembly of electronic components with adhering liquid. The heating source is particularly switched subject to the presence of separated electronic components for drying by making use of an intelligent control system which is also provided with sensors suitable for visual presence detection of the separated electronic components for drying.

In a further variant of the method according to the present invention the heating takes place using a plurality of heating elements. These heating elements can be placed successively, whereby the assembly of electronic components with adhering liquid is irradiated by successive heating elements. The advantage of such a method is that the assembly of electronic components with adhering liquid can be irradiated in a continuously operating drying process without the necessity here of having to perform the drying step according to processing step b) in stationary position. The method can be regulated such that the local irradiation time of the separated electronic components lies between 2 and 30 seconds, more preferably between 3 and 20 seconds, during the whole process.

The at least partial drying of separated electronic components with adhering liquid can also be preceded by a different drying process. Because the drying process according to the present invention is particularly effective in removing small volumes (preferably a droplet size in the order of magnitude of a few µl), it is desirable when larger volumes of residual liquid are present on the separated electronic components to have the present drying process preceded by a "pre-drying". The pre-drying can for instance be performed by means of tamponing or blowing. This type of pre-drying is not able to remove all liquid during intensive operation, although the smaller volumes of residual liquid can indeed be removed very advantageously according to the invention.

BRIEF DESCRIPTION OF THE DRAWINGS

The invention will be elucidated hereinbelow on the basis of non-limitative exemplary embodiments. Herein.

DETAILED DESCRIPTION OF THE INVENTION

Figure 1:
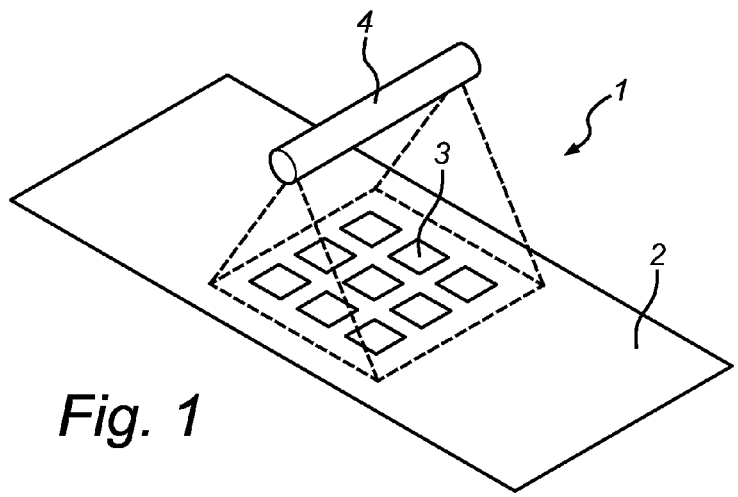
FIG. 1 is a perspective view of a schematically shown part of a device according to the present invention provided with a single heating element.

FIG. 1 is a schematic view of a part of a device 1 for drying electronic components 3, here already separated and provided with a flat carrier 2 on which the electronic components 3 are located. Device 1 is also provided a heating element 4 which is disposed in this case above carrier 2. Carrier 2 can be moved through under heating element 4, although kinematic reversal hereof is of course also possible by moving heating element 4 over carrier 2 with electronic components 3. Instead of using a flat carrier 2, use can for instance also be made of a gripper head, not shown here, with which the electronic components are gripped. Electronic components 3 with adhering liquid for removal are generally presented in a matrix orientation when coming from a preceding separating operation.

Figure 2:
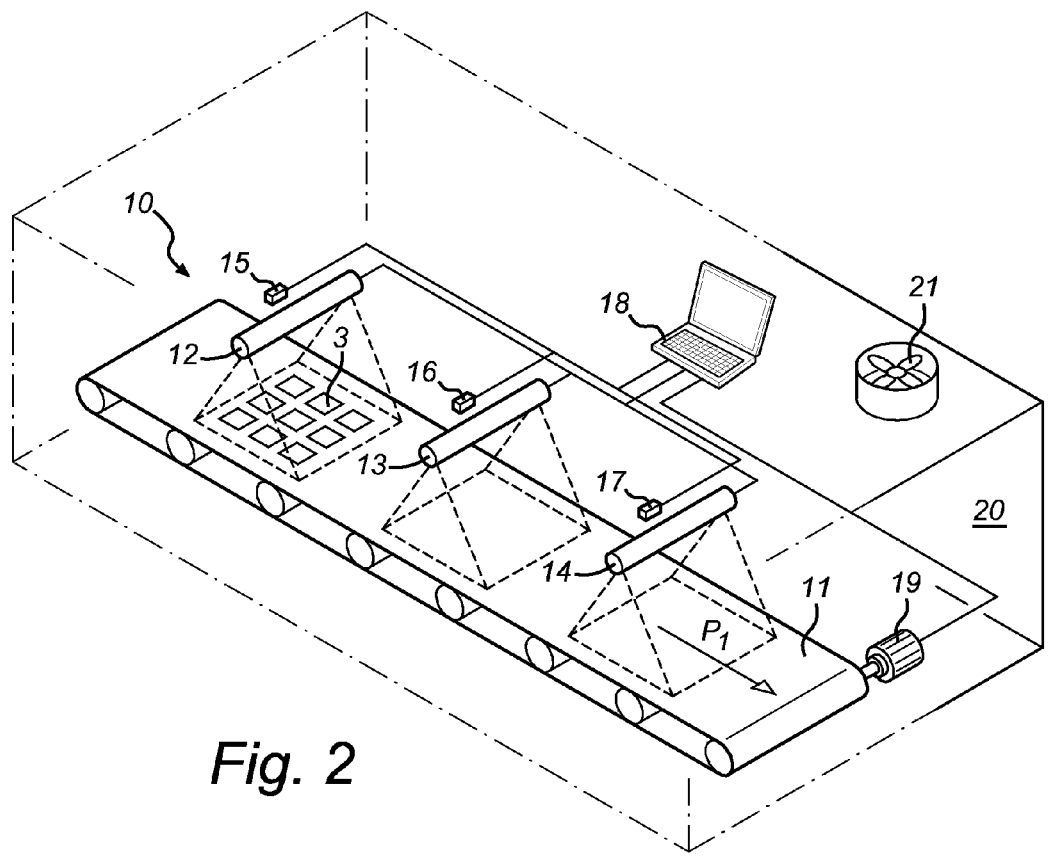
FIG. 2 is a perspective view of a schematically shown part of the device according to the present invention provided with a plurality of heating elements.

FIG. 2 is a schematic view of a part of a device 10 according to the present invention in which the already separated electronic components 3 can be dried and in which the separated components 3 are supplied by a carrier in the form of an endless conveyor belt 11. A rotating saw—not shown here—can for instance be placed upstream of the shown part of device 10. Other than the drying device 1 shown in FIG. 1, device 10 is also provided with a heating source assembled from a plurality of heating elements 12, 13, 14. The upper carrying side of the endless conveyor belt 11 moves in the direction of arrow $P_1$, wherein the electronic components are moved through under the successive heating elements 12, 13, 14. In order to for instance prevent the separated electronic components 3 being irradiated for too long by heating elements 12, 13, 14, drying device 10 is provided with detectors 15, 16, 17 which are coupled to an intelligent control 18. Using detectors 15, 16, 17 (or alternatively one or more cameras) the quality of the separated electronic components 3 can also be visually inspected in accurate manner now that they are no longer covered with adhering liquid. The intelligent control 18 can for instance regulate the transporting speed of a drive 19 of the endless conveyor belt 11 and/or control the individual endless conveyor belt 11 such that it delivers more or less heating capacity. The intelligent control can further be used to successively remove visually rejected separated electronic components 3. It is also possible to arrange above conveyor belt 11 a housing 20, indicated schematically here, to which extractor means 21 connect for the purpose of extracting air with increased air humidity surrounding electronic components 3.

Figure 3:
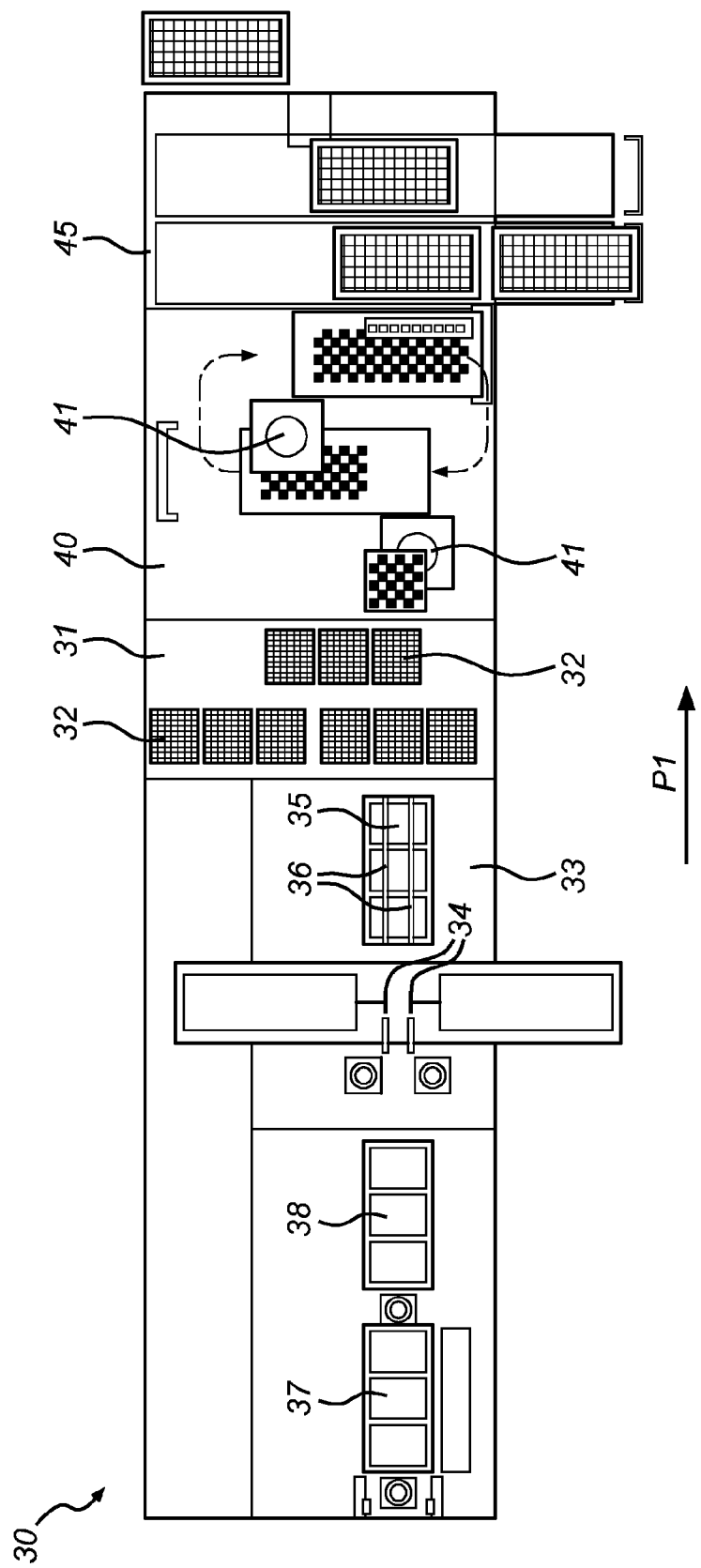
FIG. 3 is a schematic top view of a complete device for separating, at least partially drying and inspecting electronic components in an assembly with diverse additional equipment.

FIG. 3 is a schematic top view of a complete device 30 for separating, at least partially drying and inspecting electronic components in an assembly with diverse additional equipment. A module 31 is provided with a heating source—not shown here—as described above for removing liquid from separated electronic components 32. It is also possible to provide the drying module 31 with multiple drying processes, such as for instance the above described heating source with a preceding tamponing unit.

A separating module 33 is placed upstream of drying module 31 as seen in the production direction $P_1$. Two rotating saw blades 34 are disposed here to separate the not yet fully separated electronic components 35 from each other by means of saw cuts 36. The not yet fully separated electronic components 35 are normally carried a number of times along saw blades 34. Disposed upstream of separating module 33 is an aligning module 37 for the purpose of accurate positioning of the not yet divided carriers with electronic components 38.

Disposed downstream of drying module 31 as seen in the production direction $P_1$ is an inspection module 40 in which the described accurate visual inspection takes place by means of cameras 41, this being made possible by the preceding effective drying by drying module 31. It is noted that the separated electronic components are situated here in a more spaced-apart orientation (open grid) so as to still further increase the possibilities for the visual inspection. Finally placed downstream of inspection module 40 is a sorting module 45 in which the separated electronic components, for instance subject to the inspection results in inspection module 40, can be placed in carriers.

The invention claimed is:

1. A device for separating, at least partially drying and inspecting electronic components, comprising:
    a separating device for dividing a larger whole of electronic components into separated electronic components;
    a carrier for the separated electronic components;
    a heating source for generating radiant heat;
    displacing means for displacing the carrier for the separated electronic components relative to the heating source; and
    visual inspection means for inspecting the separated electronic components;
    wherein the heating source is configured to generate radiant heat with a wavelength in the range of 1 μm to 5 μm.

2. The device as claimed in claim 1, wherein the heating source comprises a heating element with a spiral filament.

3. The device as claimed in claim 1, wherein the heating source comprises a ceramic heating element.

4. The device as claimed in claim 1, wherein the heating source comprises a heating element with a quartz lamp.

5. The device as claimed in claim 1, wherein the heating source is provided with a reflector facing toward the separated electronic components for drying.

6. The device as claimed in claim 1, wherein the device is provided with insulating material.

7. The device as claimed in claim 1, further comprising an extractor for discharging gas surrounding the electronic components for drying.

8. A method for separating, at least partially drying and inspecting electronic components, comprising the processing steps of:
    a) dividing a greater whole of electronic components into an assembly of separated electronic components;
    b) displacing the separated electronic components with adhering liquid lying in a plane and held by a carrier;
    c) supplying heat to the assembly of separated electronic components with adhering liquid using a heating source; and
    d) visually inspecting the separated electronic components dried by the heating source, wherein the assembly of electronic components with adhering liquid is irradiated by the heating source with radiant heat with a wavelength in the range of 1 μm to 5 μm.

9. The method as claimed in claim 8, wherein the local irradiation of the assembly of separated electronic components with adhering liquid takes place with the heating source for a local irradiation time of 2 to 30 seconds.

10. The method as claimed in claim 8, wherein the irradiation of the assembly of separated electronic components with adhering liquid takes place with one or more heating elements with a maximum heating capacity of 1000 W.

11. The method as claimed in claim 8, wherein the assembly of separated electronic components with adhering liquid is heated with a quartz lamp.

12. The method as claimed in claim 8, wherein the liquid which has evaporated during processing step c) is extracted.

13. The method as claimed in claim 8, wherein local irradiation of the assembly of electronic components with adhering liquid takes place with a heating source which is positioned relative to the assembly of electronic components with adhering liquid such that the assembly is heated on one side or, alternatively, that both sides of the assembly are heated.

14. The method as claimed in claim 8, wherein the heating source is switched on when an assembly of electronic components with adhering liquid is present, and is switched off when a maximum irradiation time has passed or in the absence of an assembly of electronic components with adhering liquid.

15. The method as claimed in claim 8, wherein the at least partial drying of separated electronic components with adhering liquid is preceded by a different drying process.

* * * * *